(12) United States Patent
Lee et al.

(10) Patent No.: US 11,600,422 B2
(45) Date of Patent: Mar. 7, 2023

(54) CONNECTION STRUCTURE OF INDUCTIVE ELEMENT

(71) Applicant: DELTA ELECTRONICS, INC., Taoyuan (TW)

(72) Inventors: Lei-Ming Lee, Taoyuan (TW); Xin-Hung Lin, Taoyuan (TW)

(73) Assignee: DELTA ELECTRONICS INC., Taoyuan (TW)

( * ) Notice: Subject to any disclaimer, the term of this patent is extended or adjusted under 35 U.S.C. 154(b) by 1196 days.

(21) Appl. No.: 16/145,894

(22) Filed: Sep. 28, 2018

(65) Prior Publication Data
US 2019/0371509 A1 Dec. 5, 2019

(30) Foreign Application Priority Data
May 30, 2018 (CN) .......................... 201810542419.8

(51) Int. Cl.
*H01F 27/02* (2006.01)
*H01F 27/06* (2006.01)
(Continued)

(52) U.S. Cl.
CPC .......... *H01F 27/027* (2013.01); *H01F 27/06* (2013.01); *H01F 27/2823* (2013.01); *H01R 4/50* (2013.01);
(Continued)

(58) Field of Classification Search
CPC .... H01F 27/027; H01F 27/06; H01F 27/2823; H01F 2027/065; H01R 4/50; H05K 5/0008; H05K 5/0069
See application file for complete search history.

(56) References Cited

U.S. PATENT DOCUMENTS 6,011,769 A * 1/2000 Takahara ................ G11B 7/126
369/116
9,742,082 B1 * 8/2017 Ku ...................... H01R 13/6215

FOREIGN PATENT DOCUMENTS

CN 107770960 A 3/2018
EP 3285555 A1 2/2018
(Continued)

OTHER PUBLICATIONS

Taiwan Office Action dated Nov. 14, 2018 of Taiwan patent application No. 107118408, 5 pages.
(Continued)

*Primary Examiner* — Carl J Arbes
(74) *Attorney, Agent, or Firm* — Muncy, Geissler, Olds & Lowe, P.C.

(57) ABSTRACT

A connection structure of an inductive element includes a circuit substrate, in inductive element, at least one connection wire, a supporting element, a containing element, a positioning element, a connecting element, and a locking element. The circuit substrate has a through hole. Each connection wire has a first end connected to the inductive element, and a fixed terminal is disposed on a second end of the connection wire. The containing element is formed on the supporting element to provide a containing space. The positioning element is contained in the containing space, and provides a positioning part. The connecting element has a first connecting part and a second connecting part. The first connecting part is connected to the positioning part to clip the fixed terminal. The locking element has a locking part. The locking part is connected to the second connecting part to lock on the circuit substrate.

13 Claims, 12 Drawing Sheets

(51) Int. Cl.
　　　*H01F 27/28*　　　(2006.01)
　　　*H05K 5/00*　　　(2006.01)
　　　*H01R 4/50*　　　(2006.01)
(52) U.S. Cl.
　　　CPC ......... *H05K 5/0008* (2013.01); *H05K 5/0069* (2013.01); *H01F 2027/065* (2013.01)

(56) References Cited

FOREIGN PATENT DOCUMENTS

| | | | | |
|---|---|---|---|---|
| JP | 2005-273839 | A | * | 10/2005 |
| JP | 2024-072926 | A | * | 4/2014 |
| JP | 2014072926 | A | | 4/2014 |
| JP | 2018-041919 | A | * | 3/2018 |
| JP | 2018041919 | A | | 3/2018 |
| TW | 201806251 | A | | 2/2018 |

OTHER PUBLICATIONS

European search report dated Apr. 16, 2019 of European patent application No. EP18198676.1, 7 pages.
European examination report dated Sep. 30, 2020 of European patent application No. EP18198676.1, 5 pages.
Chinese Office Action dated Jan. 25, 2021 of China patent application No. 201810542419.8, 7 pages.

* cited by examiner

CONNECTION STRUCTURE OF INDUCTIVE ELEMENT

BACKGROUND

Technical Field

The present disclosure relates to a connection structure, and more particularly to a connection structure of inductive element.

Description of Related Art

The statements in this section merely provide background information related to the present disclosure and do not necessarily constitute prior art.

Please refer to FIG. 1, which shows a circuit block diagram of a grid-connected inverter system of the related art. The grid-connected inverter system is provided to convert a DC power source Vdc generated from renewable energy, such as solar energy, wind energy, or so on into an AC power source Vac to feed into an electrical grid. In the grid-connected inverter system, a front stage DC-to-DC converter 11A is used to adjust a voltage value of the DC power source Vdc, such as a boost converter for stepping up the DC power source Vdc. A next stage DC-to-AC converter 12A is used to convert the DC power source Vdc into an AC power source. The filter 13A is used to filter the AC power source to feed into the electrical grid.

In the DC-to-DC converter 11A, a boost inductor is usually used, and in the filter 13A, a filter inductor is usually used. However, unwanted interference in the system would be generated from the boost inductor and/or the filter inductor.

Please refer to FIG. 2A and FIG. 2B, which show an assembled sectional view and an assembled top view of a first connection manner between an inductor 20A and a circuit board 10A of the related art, respectively. A connection manner between an inductor 20A and a circuit board 10A is shown in FIG. 2A and FIG. 2B. The inductor 20A is electrically connected to the circuit board 10A through connection wires 21A. In this connection manner, digging holes on the circuit board 10A is necessary so that the connection wires 21A can pass through the circuit board 10A to be electrically connected to and locked on the circuit board 10A. However, it would cause damage to the connection wires 21A as well as increase process time.

Please refer to FIG. 3A and FIG. 3B, which show an assembled sectional view and an assembled top view of a second connection manner between the inductor 20A and the circuit board 10A of the related art, respectively. Another connection manner between the inductor 20A and the circuit board 10A is shown in FIG. 3A and FIG. 3B. In comparison with FIG. 2A and FIG. 2B, the connection wires 21A bypasses the circuit board 10A to be electrically connected to and locked on the circuit board 10A without digging holes on the circuit board 10A. However, it would increase costs and power consumption due to the lengthening connection wires 21A.

Moreover, in the two connection manners, since the connection wires 21A extend above the circuit board 10A, the electromagnetic interference caused by the high-frequency current flowing through the connection wires 21A to interfere circuit components mounted on the circuit substrate 10A and reduce overall efficiency.

SUMMARY

An objective of the present disclosure is to provide a connection structure of an inductive element to solve problems of increasing costs, power consumption, and electromagnetic interference due to the lengthening connection wires.

In order to achieve the above-mentioned objective, the connection structure of the inductive element includes a circuit substrate, an inductive element, at least one connection wire, a supporting element, a containing element, a positioning element, a connecting element, and a locking element. The circuit substrate has a through hole. Each connection wire has a first end and a second end opposite to the first end. The first end is connected to the inductive element and a fixed terminal is disposed on the second end. The supporting element is disposed on a base body and provided to support the connection wire. The containing element is formed on the supporting element and provides a containing space. The positioning element is contained in the containing space, and the positioning element has a positioning part. The connecting element has a first connecting part and a second connecting part, and the first connecting part is connected to the positioning part to clip the fixed terminal. The locking element has a locking part, and the locking part is connected to the second connecting part to lock on the circuit substrate.

Accordingly, the connection structure of the inductive element is provided to effectively and significantly reduce costs, power consumption, and electromagnetic interference.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWING

The present disclosure can be more fully understood by reading the following detailed description of the embodiment, with reference made to the accompanying drawings as follows.

DETAILED DESCRIPTION

Figure 1:
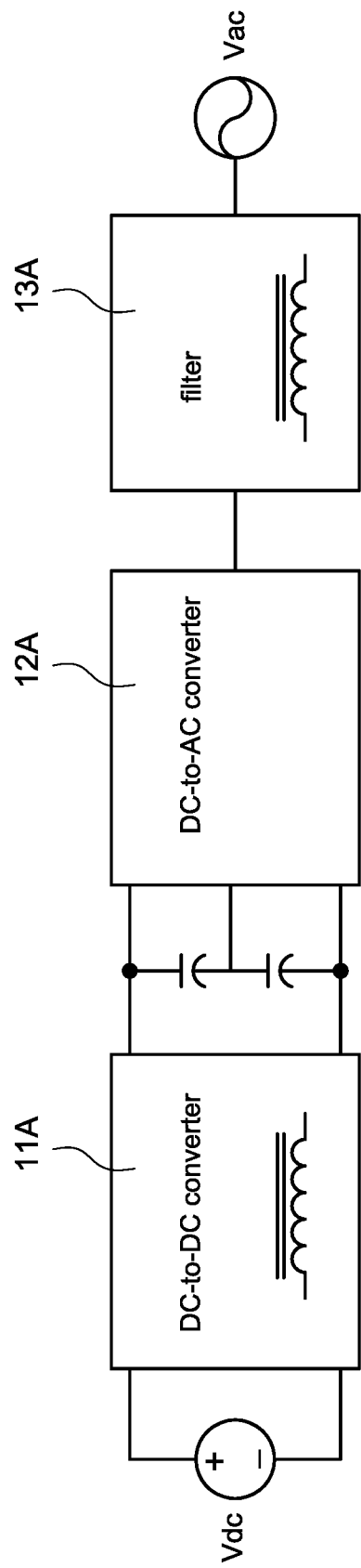
FIG. 1 is a circuit block diagram of a grid-connected inverter system of the related art.
Figure 2B:
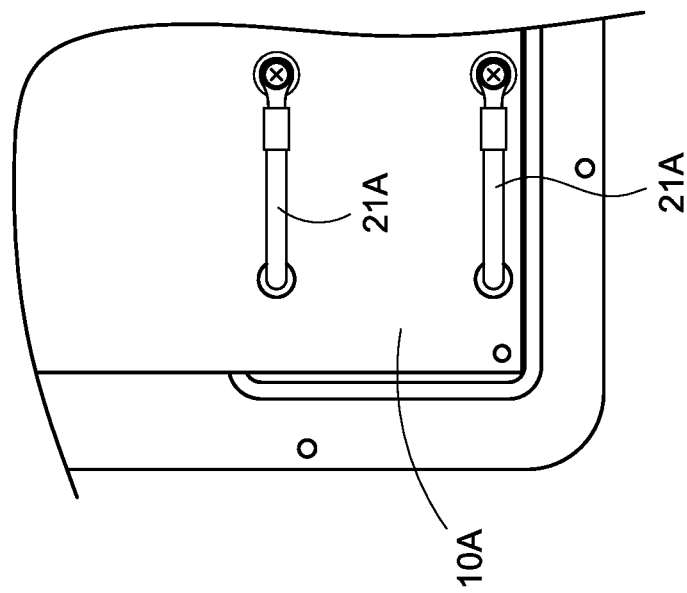
FIG. 2B is an assembled top view of the first connection manner between the inductor and the circuit board of the related art.
Figure 2A:
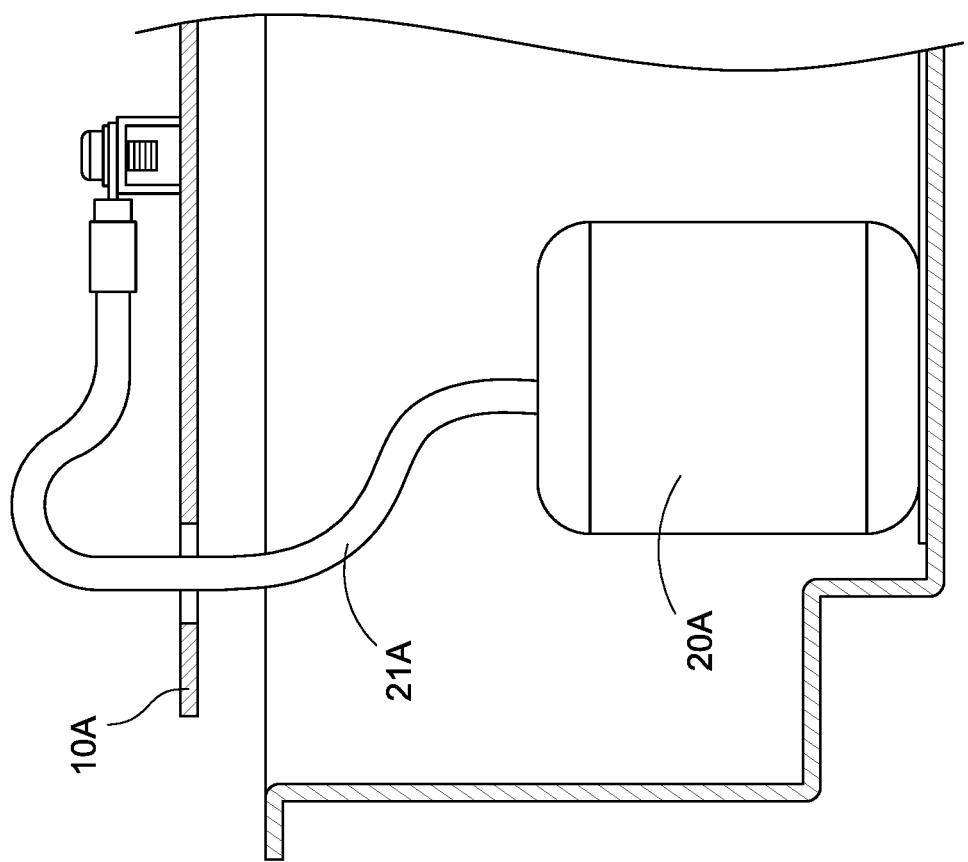
FIG. 2A is an assembled sectional view of a first connection manner between an inductor and a circuit board of the related art.
Figure 3B:
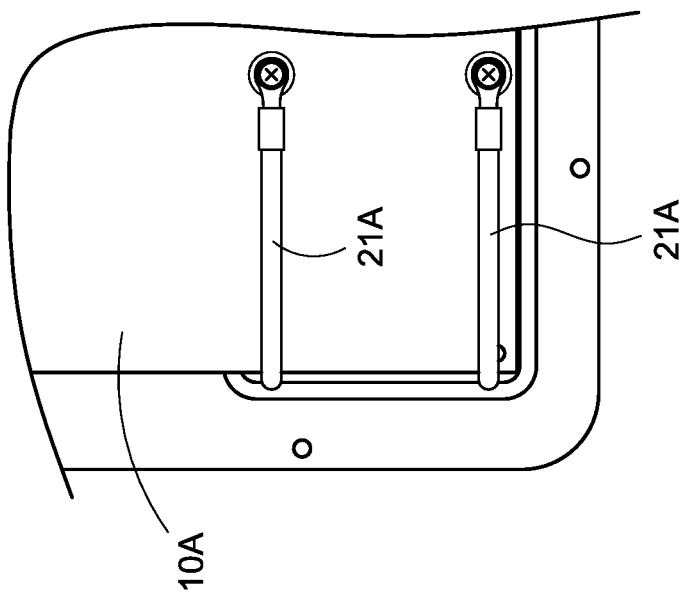
FIG. 3B is an assembled top view of the second connection manner between the inductor and the circuit board of the related art.
Figure 3A:
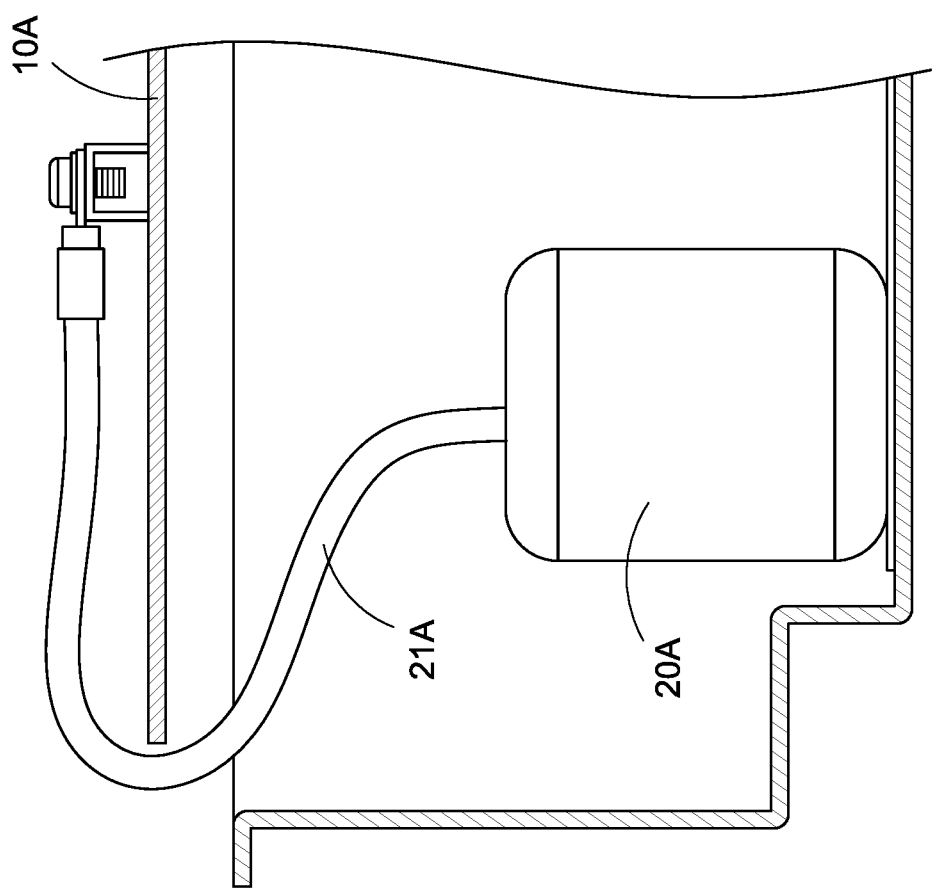
FIG. 3A is an assembled sectional view of a second connection manner between the inductor and the circuit board of the related art.

Reference will now be made to the drawing figures to describe the present disclosure in detail. It will be understood that the drawing figures and exemplified embodiments of present disclosure are not limited to the details thereof.

Figure 4:
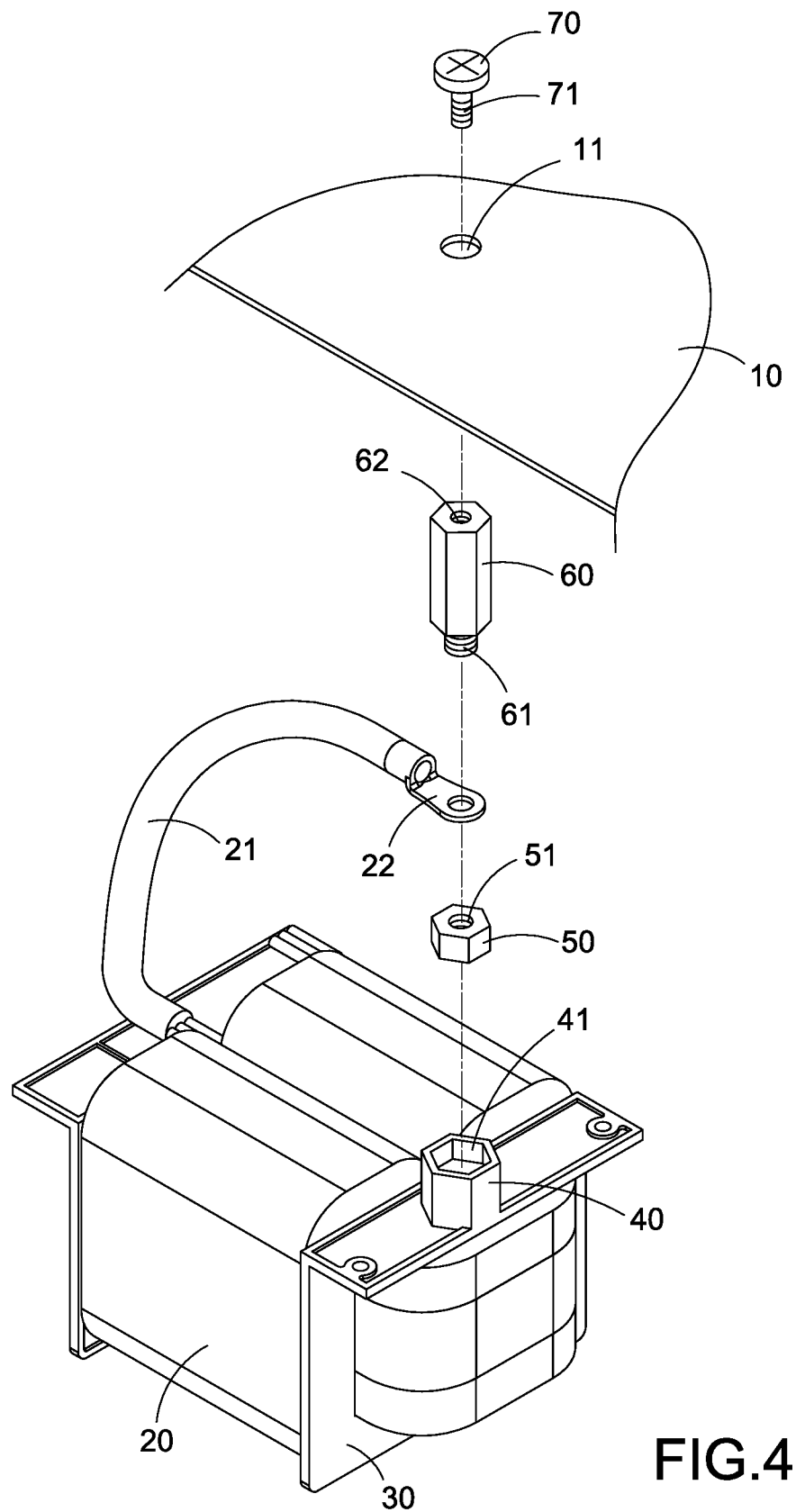
FIG. 4 is a perspective exploded view of a connection structure of an inductive element according to a first embodiment of the present disclosure.
Figure 5:
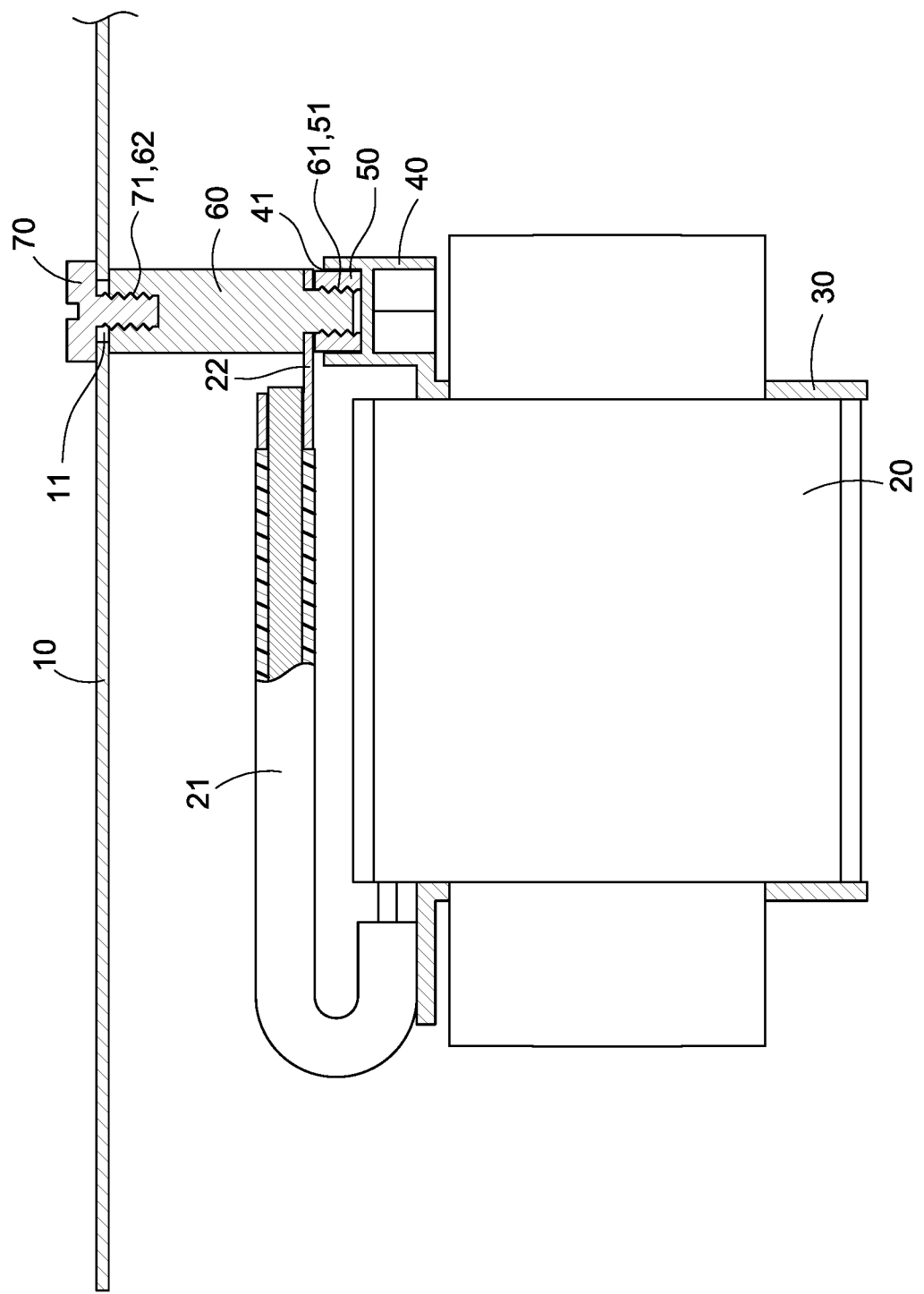
FIG. 5 is an assembled sectional view of the connection structure of the inductive element according to a first embodiment of the present disclosure.

Please refer to FIG. 4 and FIG. 5, which show a perspective exploded view and an assembled sectional view of a connection structure of an inductive element according to a first embodiment of the present disclosure, respectively. The connection structure of the inductive element (hereinafter referred to as "connection structure") includes a circuit substrate 10, an inductive element 20, at least one connection wire 21, a supporting element 30, a containing element 40, a positioning element 50, a connecting element 60, and a locking element 70. The circuit substrate 10 may be a printed circuit board (PCB) or other substrates capable of supporting circuit elements. The circuit substrate 10 has a through hole 11 thereon. The inductive element 20, such as an inductor which has a core and a coil wound on the core. In particular, the type of the core may be a U-shaped core, a block-shaped core, or others.

Each connection wire 21 may be, for example but not limited to, a cable wire. More specifically, the at least one connection wire 21 may be connected to the coil through at least one connection pin (not shown) so that an output voltage and/or an output current of the inductive element 20 can be provided through the at least one connection pin. The connection wire 21 has two ends, i.e., a first end and a second end. The first end (also referred to as "connection end") is connected to a coil wound on the core of the inductive element 20, and a fixed terminal 22 is disposed on the second end (also referred to as "free end"). In different embodiments, the fixed terminal 22 may be a ring-shaped terminal, a C-shaped terminal, a U-shaped terminal, a V-shaped terminal, or so on.

Figure 6:
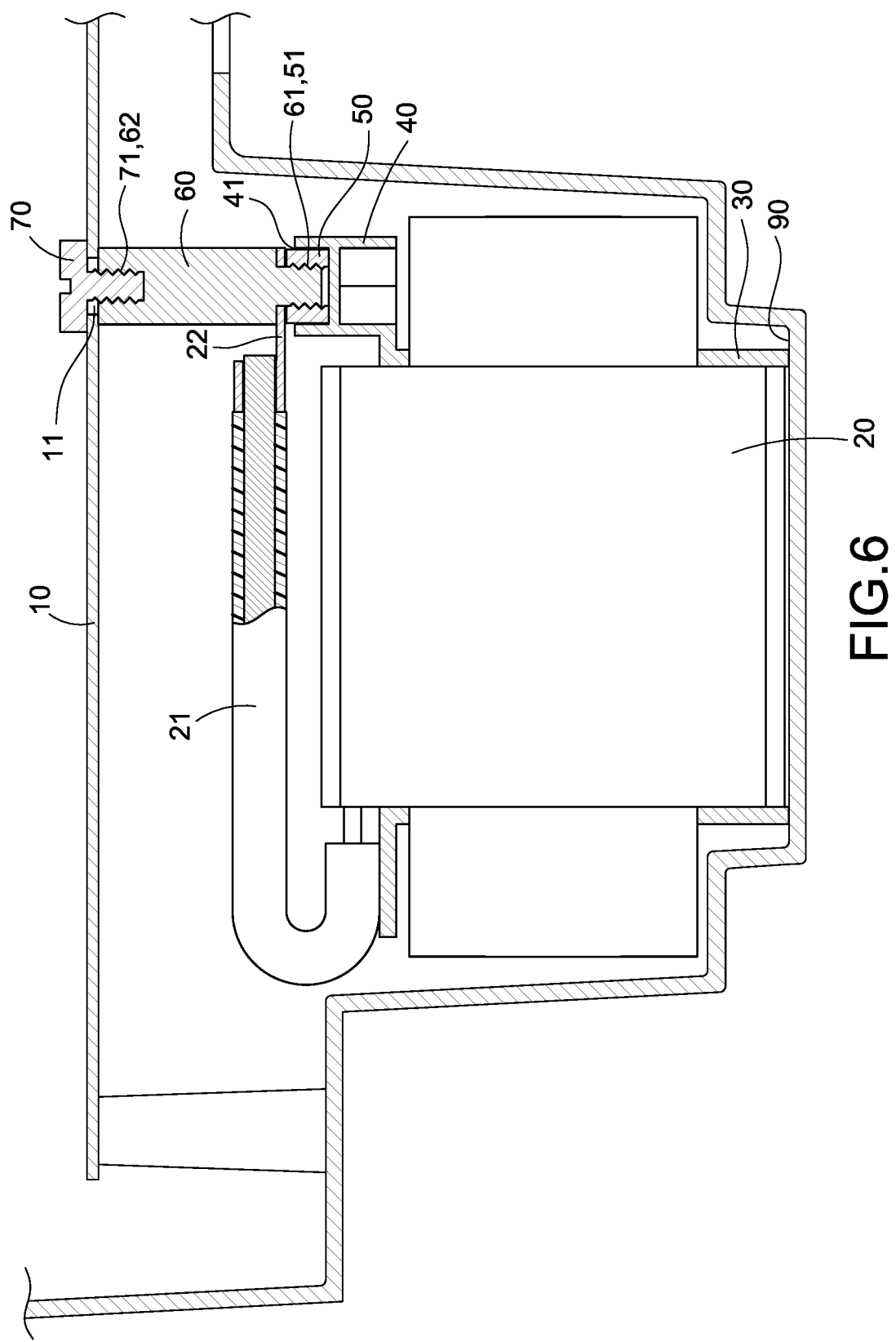
FIG. 6 is an assembled sectional view of the connection structure of the inductive element disposed on a base body according to the first embodiment of the present disclosure.

Please refer to FIG. 6, which shows an assembled sectional view of the connection structure of the inductive element disposed on a base body according to the first embodiment of the present disclosure. The major difference between FIG. 6 and FIG. 5 is that a base body 90 is illustrated in the former. The base body 90 may be an inner base of a case, and the inner base may be made of non-conductive materials or conductive materials. The inductive element 20, the circuit substrate 10, and the above-mentioned elements are contained in the case. Also, the base body 90 may be, for example but not limited to, formed by a die-casting manner. The supporting element 30 is disposed on the base body 90, namely the supporting element 30 is disposed on the inner base of the case. Further, by injecting glue into an inner space of the case, the inductive element 20 can be firmly disposed on the base body 90 and has good heat dissipation.

See FIG. 4 and FIG. 5 again, the containing element 40 is formed on the supporting element 30 to provide a containing space 41. In different embodiments, the supporting element 30 is integrally or detachably formed with the containing element 40. For example, the supporting element 30 may be integrally with the containing element 40 by an injection-molded manner or a die-casting manner so that the containing space 41 is formed in the containing element 40 and the containing element 40 is formed on the supporting element 30. Further, the supporting element 30 and the containing element 40 are two separable elements (i.e., two-piece construction), and the containing element 40 is formed on the supporting element 30 by connecting the two separable elements.

The positioning element 50 is contained in the containing space 41 of the containing element 40, and the positioning element 50 has a positioning part 51. As the embodiment shown in FIG. 4, the containing element 40 has a hexagonal cross section from top view, and the positioning element correspondingly has a hexagonal cross section from top view so that the positioning element 50 can be contained in the containing space 41 of the containing element 40. In one embodiment, the positioning element 50 is a hexagonal nut which can be a plastic nut or a metal nut. In other embodiments, the positioning element 50 may be a nut with a polygonal cross section from top view or made of another material. Also, the containing element 40 is designed corresponding to the positioning element 50.

The connecting element 60 has a first connecting part 61 and a second connecting part 62. As the embodiment shown in FIG. 4 and FIG. 5, the first connecting part 61 of the connecting element 60 passes through the fixed terminal 22, which is a ring-shaped terminal, to connect to the positioning part 51 of the positioning element 50 so that the fixed terminal 22 is clipped between the first connecting part 61 and the positioning part 51. As the embodiment shown in FIG. 4 and FIG. 5, the connecting element 60 has a hexagonal cross section from top view, and the first connecting part 61 with an external thread outwardly protrudes from one end of the connecting element 60. The positioning part 51 of the positioning element 50 is a concave structure. Take the positioning element 50 as the hexagonal nut for example, the positioning part 51 is an internal thread of the hexagonal nut. Accordingly, the first connecting part 61 with the external thread passes through the fixed terminal 22 to connect to the internal thread, namely the positioning part 51 of the hexagonal nut by a screw connection manner. When the first connecting part 61 is screwed and fastened to the positioning part 51, the fixed terminal 22 can be clipped between the first connecting part 61 and the positioning part 51.

The locking element 70 has a locking part 71. As the embodiment shown in FIG. 4, the locking part 71 of the locking element 70 passes through the through hole 11 of the circuit substrate 10 to connect to the second connecting part 62 of the connecting element 60 so that the locking element 70 locks on the circuit substrate 10. As the embodiment shown in FIG. 4 and FIG. 5, the second connecting part 62 of the connecting element 60 is a concave structure. Take the connecting element 60 as a hexagonal column for example, the second connecting part 62 is an internal thread of the hexagonal column. Also, the locking part 71 with an external thread outwardly protrudes from one end of the locking element 70. In this embodiment, the locking element 70 may be a screw. Accordingly, the locking part 71 with the external thread passes through the through hole 11 of the circuit substrate 10 to connect to the internal thread, namely the second connecting part 62 of the hexagonal column by a screw connection manner. When the locking part 71 is screwed and fastened to the second connecting part 62, the circuit substrate 10 can be clipped between the locking part 71 and the second connecting part 62, namely the locking element 70 locks on the circuit substrate 10.

Figure 7:
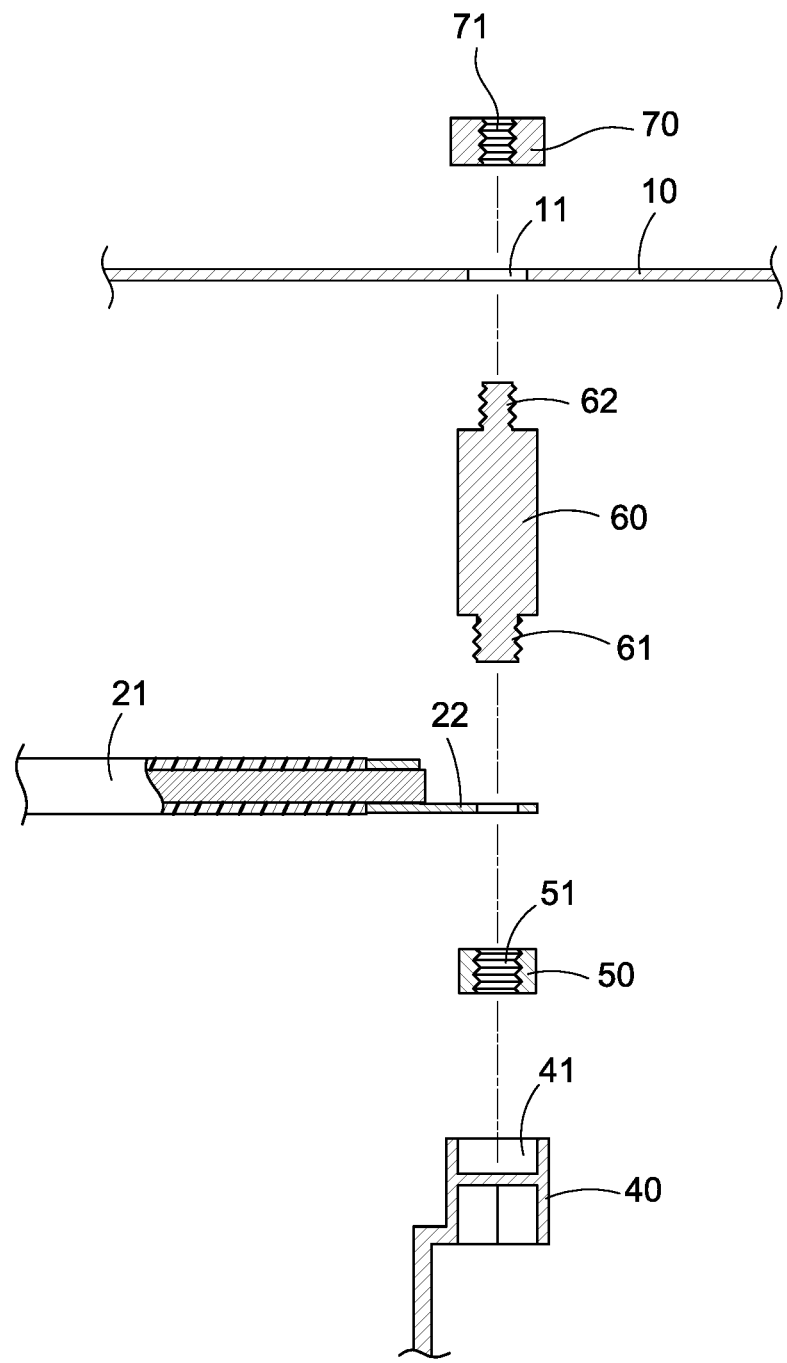
FIG. 7 is a partial perspective exploded view of the connection structure of the inductive element according to a second embodiment of the present disclosure.
Figure 8:
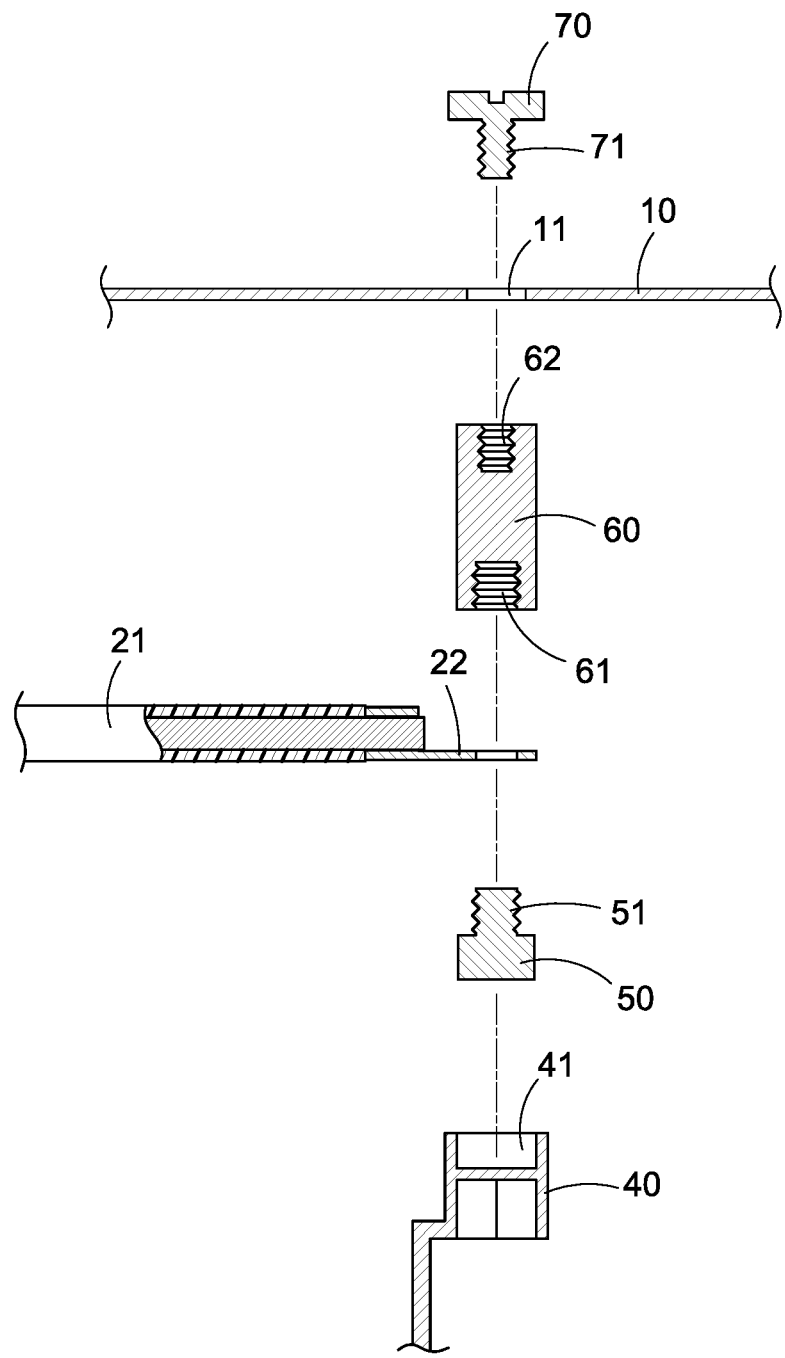
FIG. 8 is a partial perspective exploded view of the connection structure of the inductive element according to a third embodiment of the present disclosure.
Figure 9:
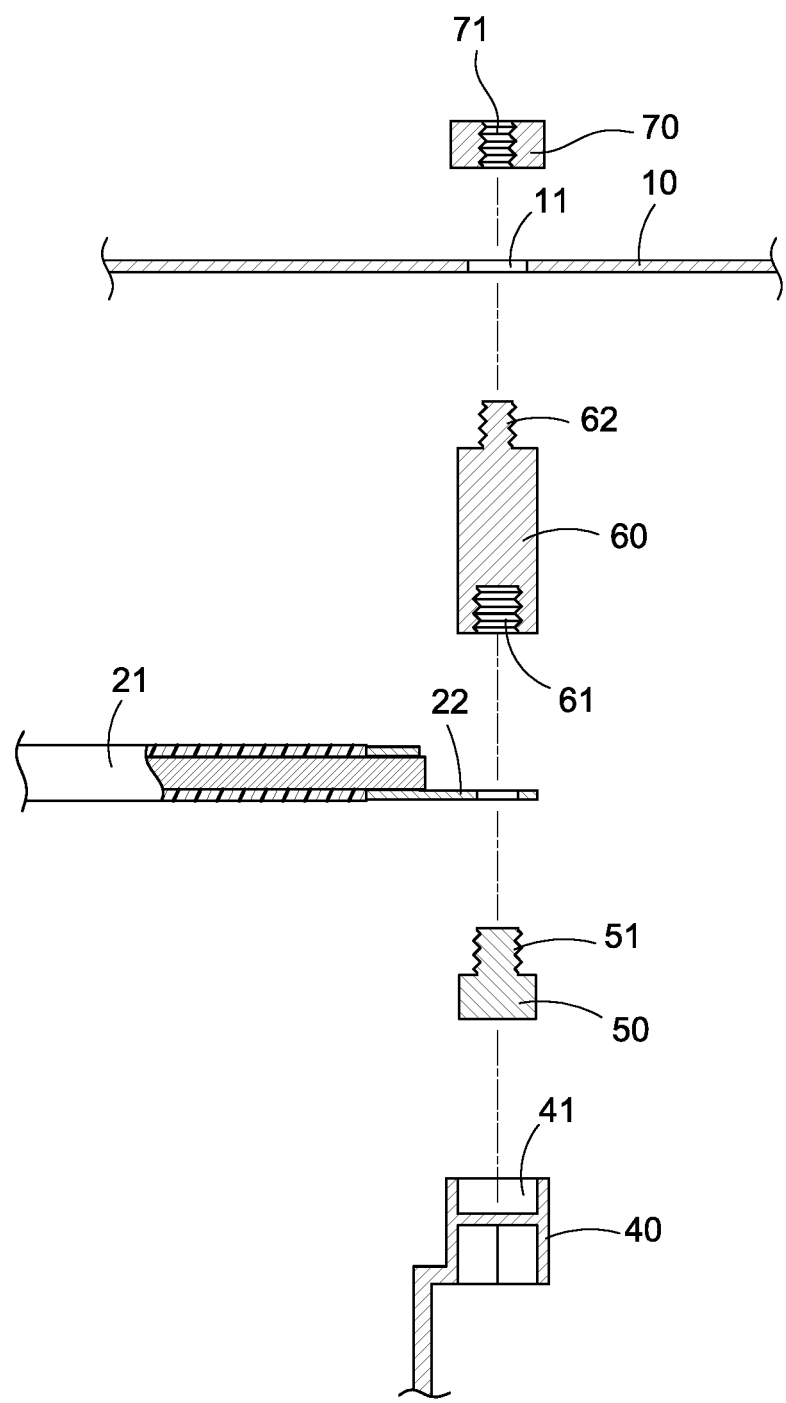
FIG. 9 is a partial perspective exploded view of the connection structure of the inductive element according to a fourth embodiment of the present disclosure.

Please refer to FIG. 7, FIG. 8, and FIG. 9, which show partial perspective exploded views of the connection structure of the inductive element according to a second embodiment, a third embodiment, and a fourth embodiment of the present disclosure, respectively. These embodiments show different connection designs between the positioning part 51 and the first connecting part 61 and between the locking part 71 and the second connecting part 62.

As the second embodiment shown in FIG. 7, the positioning part 51 of the positioning element 50 is a concave structure, and therefore the first connecting part 61 of the connecting element 60 is correspondingly a convex structure. Moreover, the second connecting part 62 of the connecting element 60 is a convex structure, and therefore the locking part 71 of the locking element 70 is correspondingly a concave structure.

As the third embodiment shown in FIG. 8, the positioning part 51 of the positioning element 50 is a convex structure, and therefore the first connecting part 61 of the connecting element 60 is correspondingly a concave structure. Moreover, the second connecting part 62 of the connecting element 60 is a concave structure, and therefore the locking part 71 of the locking element 70 is correspondingly a convex structure.

As the fourth embodiment shown in FIG. 9, the positioning part 51 of the positioning element 50 is a convex structure, and therefore the first connecting part 61 of the connecting element 60 is correspondingly a concave structure. Moreover, the second connecting part 62 of the connecting element 60 is a convex structure, and therefore the locking part 71 of the locking element 70 is correspondingly a concave structure.

The four different connection designs between the positioning part 51 and the first connecting part 61 and between the locking part 71 and the second connecting part 62 are not limited to implement by the hexagonal nut or the hexagonal column with the internal thread for the concave structure and to implement by the hexagonal column or the screw with the external thread for the convex structure. As long as a component which has connecting and/or locking functions, it would be used as the positioning part 51, the first connecting part 61, the second connecting part 62, or the locking part 71, that is, the concave structure is not limited to be implemented by the nut with the internal thread and the convex structure is not limited to be implemented by the screw with the external thread.

Figure 10:
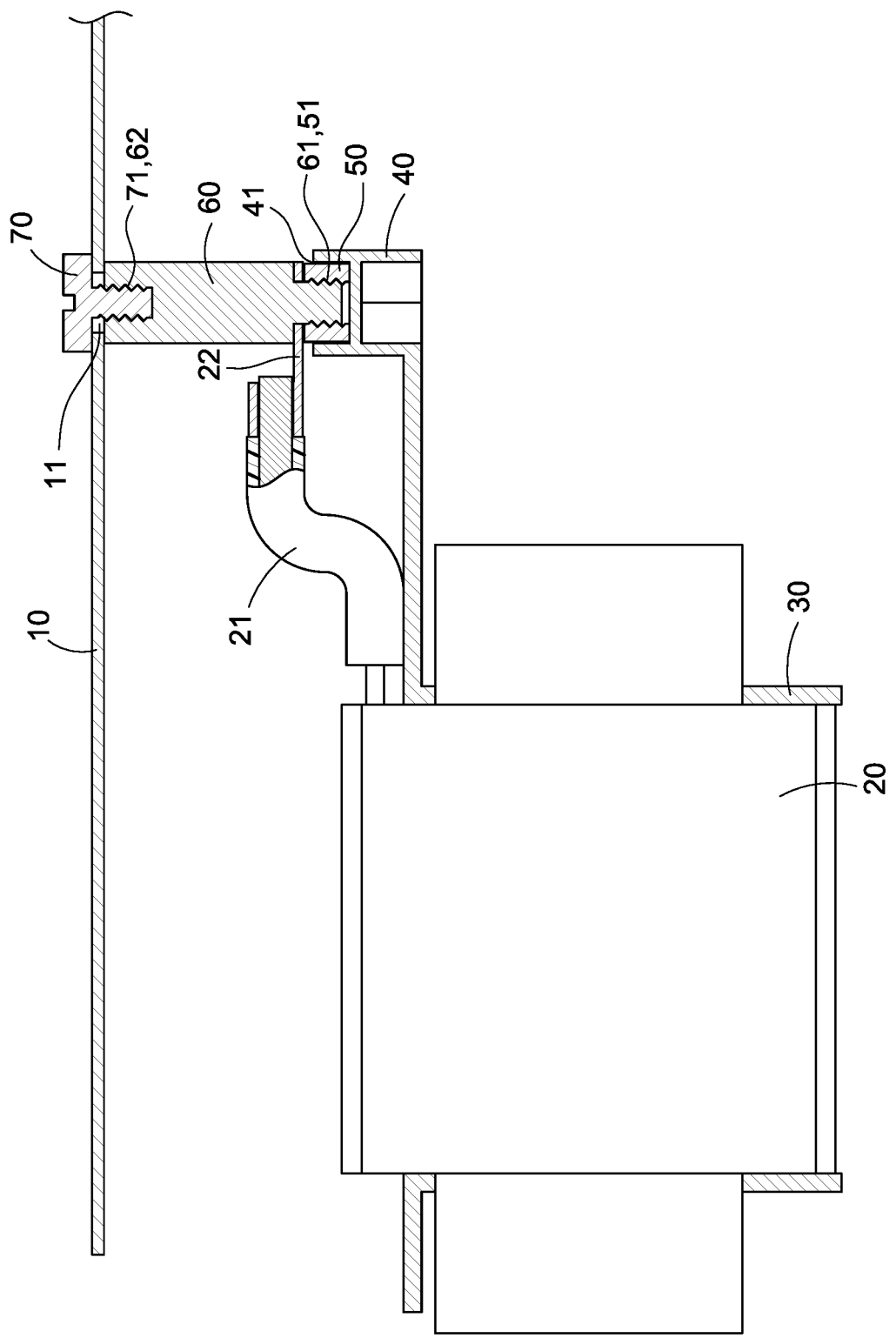
FIG. 10 is an assembled sectional view of the connection structure of the inductive element according to a fifth embodiment of the present disclosure.

Please refer to FIG. 10, which shows an assembled sectional view of the connection structure of the inductive element according to a fifth embodiment of the present disclosure. The major difference between FIG. 10 and FIG. 5 is that the position of the connection wire 21 extending from the inductive element 20 is different. In the latter shown in FIG. 5, the connection wire 21 is extended from at one side, which is away from the positioning element 50 (or the connecting element 60, the locking element 70) of the inductive element 20. From the view of FIG. 5, the connection wire 21 is connected at a left side of the inductive element 20 and extended to the positioning element 50. If the connection wire is not easily bent, the configuration shown in FIG. 5 is beneficial to reduce the distance between the inductive element 20 and the connecting element 60 (or the locking element 70), thereby saving the inner space of the case. In comparison with FIG. 5, if the connection wire is easily bent, the connection wire 21 shown in FIG. 10 is extended from at one side, which is near to the positioning element 50 (or the connecting element 60, the locking element 70) of the inductive element 20. From the view of FIG. 10, the connection wire 21 is connected at a right side of the inductive element 20 and extended to the positioning element 50. Therefore, the configuration shown in FIG. 10 is beneficial to significantly shorten length and reduce costs of the connection wire 21.

Figure 11:
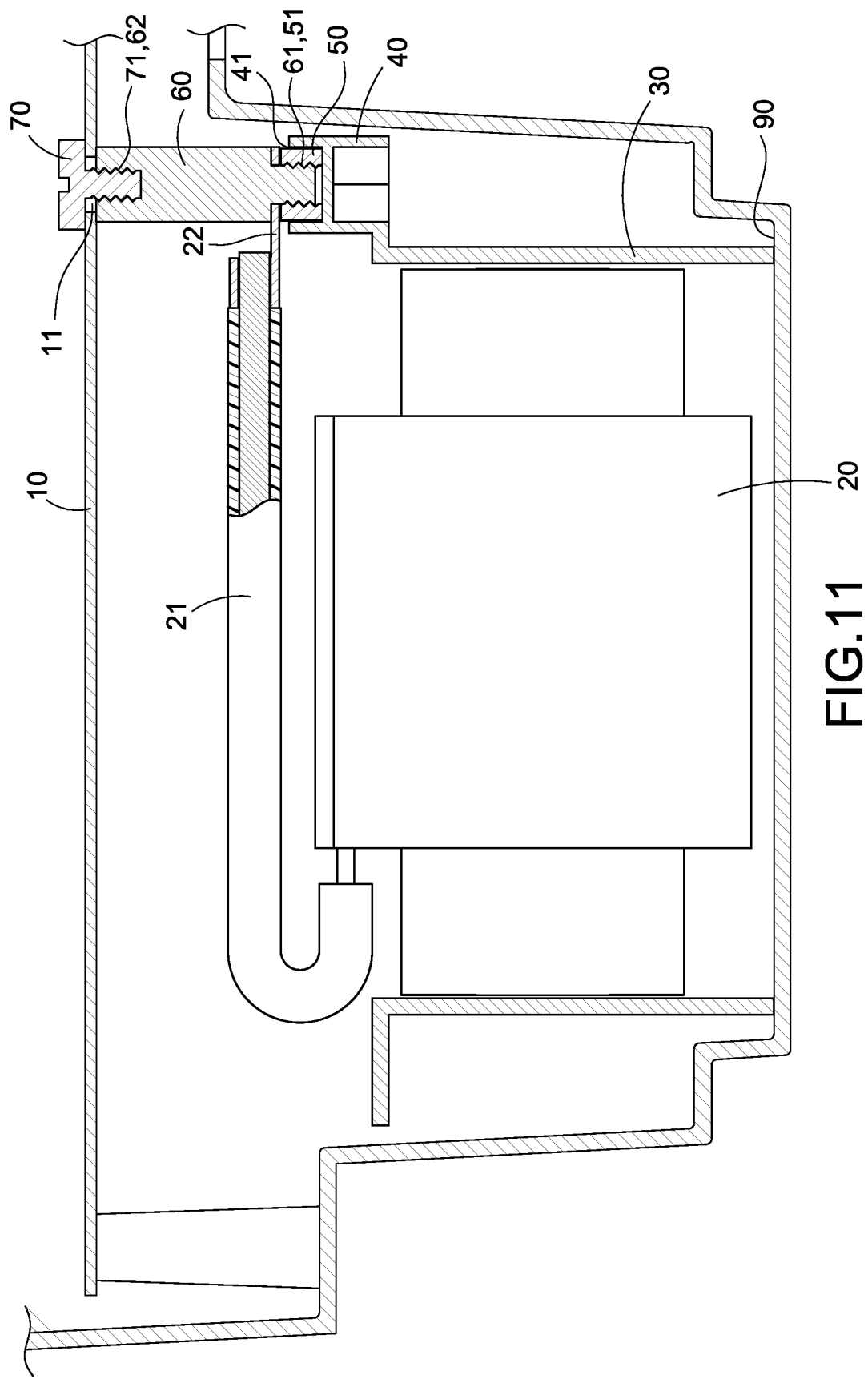
FIG. 11 is an assembled sectional view of the connection structure of the inductive element according to a sixth embodiment of the present disclosure.

Please refer to FIG. 11, which shows an assembled sectional view of the connection structure of the inductive element according to a sixth embodiment of the present disclosure. The major difference between FIG. 11 and FIG. 6 is that the position of the supporting element 30 corresponding to the inductive element 20 is different. In the latter shown in FIG. 6, the supporting element 30 is disposed in a space between the core and the coil, namely the supporting element 30 is disposed inside the inductive element 20. In comparison with FIG. 6, the supporting element 30 is not disposed in the space between the core and the coil, namely the supporting element 30 is disposed outside the inductive element 20. Moreover, the position of the supporting element 30 is not limited to the above-mentioned embodiments, and therefore the position of the supporting element 30 corresponding to the inductive element 20 may be adjusted according to the type of the core, the available space, or so on. Regardless of the U-shaped core or the block-shaped core, the connection relationship among the circuit substrate 10, the inductive element 20, the supporting element 30, the containing element 40, the positioning element 50, the connecting element 60, and the locking element 70 can be implemented.

Figure 12:
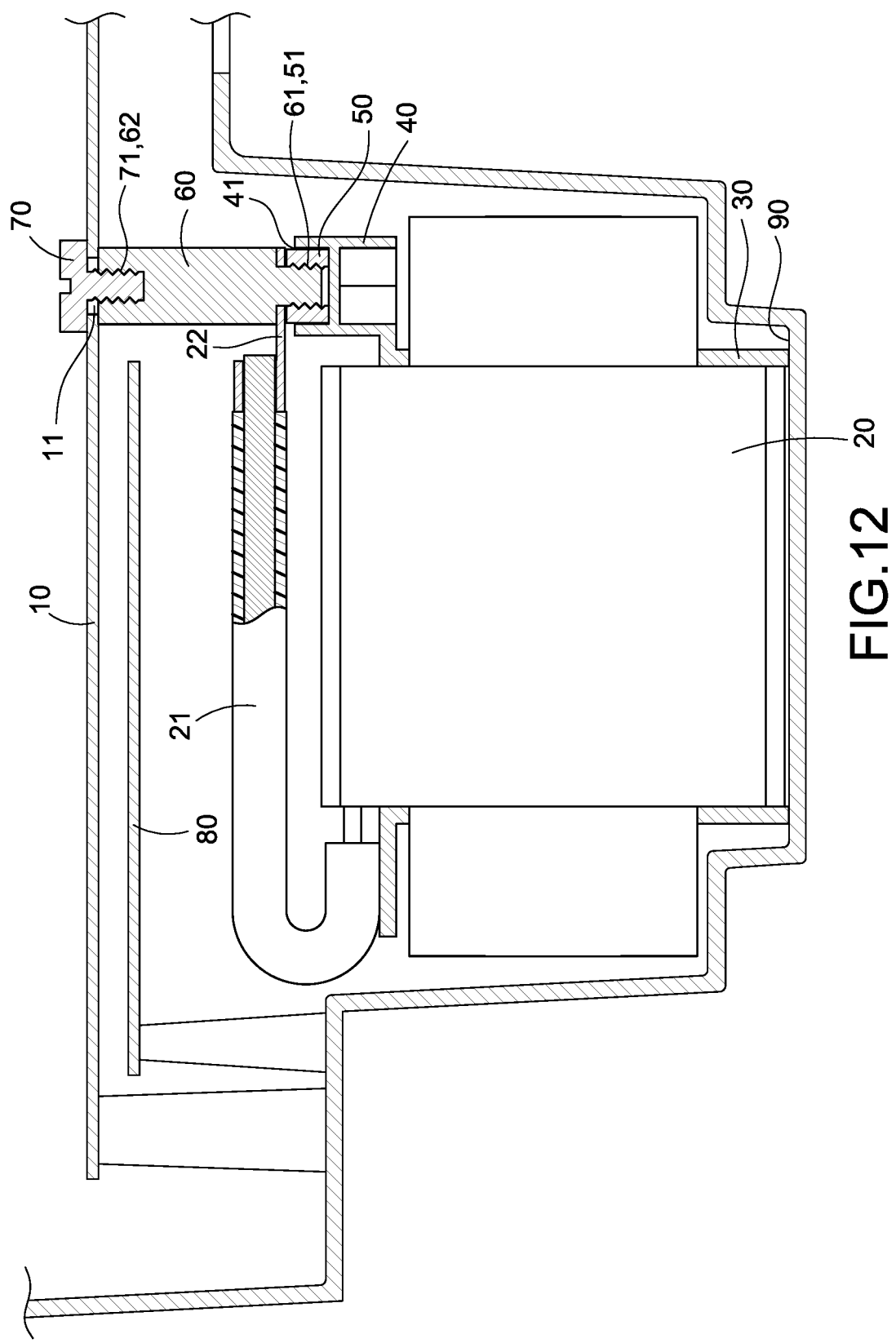
FIG. 12 is an assembled sectional view of the connection structure of the inductive element according to a seventh embodiment of the present disclosure.

Please refer to FIG. 12, which shows an assembled sectional view of the connection structure of the inductive element according to a seventh embodiment of the present disclosure. In this embodiment, the connection structure further includes a metal plate 80. The metal plate 80 is disposed between the circuit substrate 10 and the connection wire 21 for providing radiation shielding, thereby significantly reducing electromagnetic interference caused by the high-frequency current flowing through the connection wire 21 to interfere circuit components mounted on the circuit substrate 10.

In conclusion, the present disclosure has following features and advantages:

1. The connection structure of the inductive element is provided to shorten length of the connection wire, reduce required costs, and reduce power consumption.

2. The connection structure of the inductive element is provided to reduce electromagnetic interference and increase overall efficiency.

3. The positioning part, the first connecting part, the second connecting part, and the locking part can be concave structure or convex structure to increase design diversity and convenience of use.

4. The glue is injected into the inner space of the case to fix the inductive element and make the inductive element have good heat dissipation.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A connection structure of an inductive element, comprising:
   a circuit substrate having a through hole;
   an inductive element and at least one connection wire, and each connection wire having a first end connected to the inductive element and a second end being opposite to the first end and having a fixed terminal disposed on the second end;
   a supporting element disposed on a base body, arranged in a contact manner with and inside the inductive element, and configured to support the connection wire;
   a containing element formed on the supporting element and configured to provide a containing space;
   a positioning element contained in the containing space, and the positioning element having a positioning part;
   a connecting element having a first connecting part and a second connecting part, and the first connecting part connected to the positioning part to clip the fixed terminal; and
   a locking element having a locking part, and the locking part configured to connect to the second connecting part to lock the locking element and the connecting element on the circuit substrate.

2. The connection structure of the inductive element in claim 1, wherein the positioning part is a concave structure, the first connecting part is a convex structure, the second connecting part is a concave structure, and the locking part is a convex structure.

3. The connection structure of the inductive element in claim 1, wherein the positioning part is a concave structure, the first connecting part is a convex structure, the second connecting part is a convex structure, and the locking part is a concave structure.

4. The connection structure of the inductive element in claim 1, wherein the positioning part is a convex structure, the first connecting part is a concave structure, the second connecting part is a concave structure, and the locking part is a convex structure.

5. The connection structure of the inductive element in claim 1, wherein the positioning part is a convex structure, the first connecting part is a concave structure, the second connecting part is a convex structure, and the locking part is a concave structure.

6. The connection structure of the inductive element in claim 1, wherein the connection wire is connected to one side, which is away from the positioning element, the connecting element, or the locking element, of the inductive element.

7. The connection structure of the inductive element in claim 1, wherein the connection wire is connected to one side, which is near the positioning element, the connecting element, or the locking element, of the inductive element.

8. The connection structure of the inductive element in claim 1, further comprising:
   a metal plate disposed between the circuit substrate and the connection wire.

9. The connection structure of the inductive element in claim 1, wherein the fixed terminal is a ring-shaped terminal, a C-shaped terminal, a U-shaped terminal, or a V-shaped terminal.

10. The connection structure of the inductive element in claim 1, wherein the supporting element is integrally or detachably formed with the containing element.

11. The connection structure of the inductive element in claim 1, wherein the base body is an inner base of a case, and a glue is injected into an inner space of the case to fix the inductive element.

12. The connection structure of the inductive element in claim 2, wherein the positioning element is a nut.

13. The connection structure of the inductive element in claim 2, wherein the locking element is a screw.

* * * * *